United States Patent
Nikolov et al.

(10) Patent No.: US 11,600,963 B2
(45) Date of Patent: Mar. 7, 2023

(54) DIAMOND-BASED HIGH-STABILITY OPTICAL DEVICES FOR PRECISION FREQUENCY AND TIME GENERATION

(71) Applicant: The Boeing Company, Chicago, IL (US)

(72) Inventors: Anguel Nikolov, Culver City, CA (US); John R. Lowell, Fairfax, VA (US); David K. Mefford, Brownsboro, AL (US); John Dalton Williams, Decatur, AL (US)

(73) Assignee: The Boeing Company, Arlington, VA (US)

( * ) Notice: Subject to any disclaimer, the term of this patent is extended or adjusted under 35 U.S.C. 154(b) by 287 days.

(21) Appl. No.: 16/855,084

(22) Filed: Apr. 22, 2020

(65) Prior Publication Data

US 2021/0336409 A1    Oct. 28, 2021

(51) Int. Cl.
| | |
|---|---|
| H01S 3/042 | (2006.01) |
| H01S 3/30 | (2006.01) |
| H01S 3/063 | (2006.01) |
| G02F 1/21 | (2006.01) |
| H01S 3/16 | (2006.01) |

(52) U.S. Cl.
CPC .............. *H01S 3/30* (2013.01); *G02F 1/213* (2021.01); *H01S 3/042* (2013.01); *H01S 3/063* (2013.01); *H01S 3/1603* (2013.01)

(58) Field of Classification Search
CPC .......... H01S 3/04; H01S 3/0405; H01S 3/042; H01S 3/1303; G02F 1/2131; G02F 1/21; G02F 1/213
See application file for complete search history.

(56) References Cited

U.S. PATENT DOCUMENTS

| | | | |
|---|---|---|---|
| 5,812,573 A | 9/1998 | Shiomi et al. | |
| 8,143,956 B2 | 3/2012 | Chen | |
| 8,831,056 B2 | 9/2014 | Savchenkov et al. | |
| 9,017,633 B2 * | 4/2015 | Friel | C30B 25/02 |
| | | | 117/88 |
| 9,658,513 B2 | 5/2017 | Mildren et al. | |
| 9,837,787 B2 | 12/2017 | Spence et al. | |

(Continued)

OTHER PUBLICATIONS

Garrett D. Cole et al. "Tenfold reduction of Brownian noise in optical interferometry" Cornell University, arXiv:1302.6489 [physics.optics], (arxiv.org) pp. 1-31, 2013 (Year: 2013).*

(Continued)

*Primary Examiner* — Xinning(Tom) Niu
*Assistant Examiner* — Delma R Fordé
(74) *Attorney, Agent, or Firm* — Ostrager Chong Flaherty & Broitman P.C.

(57) ABSTRACT

Chip technology for fabricating ultra-low-noise, high-stability optical devices for use in an optical atomic clock system. The proposed chip technology uses diamond material to form stabilized lasers, frequency references, and passive laser cavity structures. By utilizing the exceptional thermal conductivity of diamond and other optical and dielectric properties, a specific temperature range of operation is proposed that allows significant reduction of the total energy required to generate and maintain an ultra-stable laser. In each configuration, the diamond-based chip is cooled by a cryogenic cooler containing liquid nitrogen.

17 Claims, 7 Drawing Sheets

(56) References Cited

U.S. PATENT DOCUMENTS

| 9,882,344 | B2 | 1/2018 | Mildren |
| 9,893,486 | B2 | 2/2018 | Eden et al. |
| 9,983,550 | B2 | 5/2018 | Liang et al. |
| 2005/0163169 | A1 | 7/2005 | Lawandy et al. |
| 2019/0280456 | A1 | 11/2019 | Williams et al. |
| 2021/0336409 | A1* | 10/2021 | Nikolov .................... H01S 3/30 |

OTHER PUBLICATIONS

Mickail V. Kuvshinskii et al. "Tests of Cryogenic Fabry-Perot Cavity with Mirrors on Different Substrates" Appl. Sci. 2019, 9, 230; pp. 1-12, Jan. 10, 2019 (Year: 2019).*

Latawiec et al., "On-chip diamond Raman laser", Optica, vol. 2, No. 11, Nov. 2015, pp. 924-928.

Williams et al., "High Power Diamond Raman Lasers", IEEE J. Selected Topics in Quantum Electronics, vol. 24, No. 5, Sep./Oct. 2018.

Swierad et al., "Ultra-stable clock laser system development towards space applications,"Scientific Reports, Sep. 26, 2016.

Zhang et al., "An ultrastable silicon cavity in a continuously operating closed-cycle cryostat at 4 K", Phys. Rev. Lett., vol. 119, Issue 24, Dec. 15, 2017.

Thorpe et al., "Frequency-stabilization to 6 × 10-16 via spectral-hole burning", Oct. 23, 2018.

Liu et al., "Wide Tunable Double Ring Resonator Coupled Lasers", IEEE Photonics Technology Letters, vol. 14, No. 5, May (2002), pp. 600-602.

Rabus et al., "A GaInAsP—InP Double-Ring Resonator Coupled Laser", IEEE Photonics Technology Letters, vol. 17, No. 9, Sept (2005), pp. 1770-1772.

* cited by examiner

DIAMOND-BASED HIGH-STABILITY OPTICAL DEVICES FOR PRECISION FREQUENCY AND TIME GENERATION

BACKGROUND

This disclosure generally relates to optical oscillators for precision frequency and time generation and, in particular, relates to ultra-stable, narrow-linewidth laser devices which output a stabilized optical frequency reference to be used in optical atomic clocks.

The Global Positioning System (GPS) is based on cesium fountain clocks stationed on satellites for time reference in coordinate calculations. Cesium clocks rely on microwave transitions. These clocks are periodically synchronized to a master clock based on the Earth. Future navigation networks and systems will require higher precision and lower uncertainty of both the master clocks and the subordinate clocks.

Current ultra-stable, state-of-the-art frequency and time references are based on optical atomic clocks. Optical atomic clocks have inherent physical advantages over cesium clocks: optical atomic clocks use higher (optical) clock frequencies versus microwave clock frequencies for the cesium clocks. The fractional uncertainty of a clock decreases as the frequency increases. In addition, optical atomic clocks utilize high-finesse cavities, which leads to ultra-narrow and stable laser sources. (As used herein, the term "cavity" is synonymous with "optical resonator." The finesse of an optical resonator (cavity) is defined as its free spectral range divided by the full-width-at-half-maximum (FWHM) bandwidth of its resonances.)

By design most optical atomic clocks are based on two key components: (1) an ultra-stable, narrow-linewidth laser; and (2) an atomic system that offers a very narrow linewidth transition that serves as the absolute stability reference. The actual implementation of such systems is very complicated and utilizes large setups populated with multiple subcomponents.

Reductions in the cost, weight, size, and power consumption of optical atomic clocks would enable fabrication of compact optical atomic clocks and their possible development for space operation.

SUMMARY

The subject matter disclosed in some detail below is directed to chip technology for fabricating ultra-low-noise, high-stability optical devices for use in an optical atomic clock system. The proposed chip technology uses diamond material grown by chemical vapor deposition (hereinafter "CVD diamond") to form lasers, frequency references, and passive laser cavity structures. By utilizing the exceptional thermal conductivity of diamond and other optical and dielectric properties, a specific temperature range of operation is proposed that allows significant reduction of the total energy required to generate and maintain an ultra-stable laser. The chip technology disclosed herein also enables dramatic reduction of the form factor of current state-of-the-art technologies for implementation of ultra-stable optical resonators.

In each configuration, the diamond-based chip is cooled by a cryogenic cooler containing liquid nitrogen. It is critical that the optical source be on a small chip, not free space optics, because the whole assembly needs to be kept at the same low cryogenic temperature, and there should be no relative vibrations between the individual elements as would be the case in a free space with discrete mirrors. The whole chip assembly, including package and fibers, is held at cryogenic temperatures between 40 to 100° K. The whole assembly is coupled to a cryogenic cold finger in a way that minimizes external vibrations.

In accordance with a first proposed implementation disclosed in more detail below, a CVD diamond passive cavity in chip form is ultra-stable and has very high finesse. The CVD diamond cavity is used to generate an error signal, which error signal is used by an electronic servo loop to further stabilize the laser in terms of frequency and phase noise reduction. A cryogenic cooler ensures that the operating point of the CVD diamond cavity is maintained for maximum performance stability.

In accordance with a second proposed implementation, an ultra-stable, narrow-linewidth Raman laser based on lasing in CVD diamond is provided. A Raman ring (or racetrack) chip uses low-loss waveguides etched from CVD diamond wafers. The chip includes a Raman gain ring (or racetrack) and a Stokes resonator ring (or racetrack) to achieve a high Q factor (high finesse). A pump laser generates lasing (Stokes light) in the Raman gain ring. Then a Stokes resonator ring out couples (to an output waveguide) a lasing having a linewidth which is further reduced. The rings have dimensions (circumference) selected to enhance the Raman effect in the gain ring and only couple the first-order Stokes light into the filter ring. The filter ring has to be significantly larger than the gain ring. The chip is pumped with a narrow-wavelength low-relative intensity noise (low-RIN) laser.

In accordance with a third proposed implementation, an ultra-stable, narrow-linewidth, rare earth-doped laser based on lasing in CVD diamond is provided. A pump laser is coupled into a CVD diamond waveguide, which transfers light into a CVD diamond ring (or racetrack) chip implemented with a low-loss waveguide to achieve a high-Q factor (high-finesse) resonator. The gain ring is doped with rare earth ions which, when pumped by the coupled pump laser, generate lasing at a longer wavelength. This new wavelength is out coupled by an additional ring (hereinafter "filter resonator ring"), which also has a very high Q factor. The filter resonator ring further reduces the linewidth of the generated radiation. An output waveguide is provided in proximity to the filter resonator ring. Part of the resonant light in the filter resonator ring is coupled out into the output waveguide and guided toward the chip output.

In accordance with a fourth proposed implementation, an ultra-stable, narrow-linewidth frequency reference based on spectral hole burning in rare earth-doped CVD diamond crystals is provided. The CVD diamond is doped with rare earth ions. This is done to create frequency-selective optical pumping of inhomogeneously broadened absorption lines to spectrally tailor the material response. A narrow-linewidth laser is used to temporarily excite a subset of the ions and remove them from the absorption population. This allows generation of very narrow-linewidth transmission "spectral holes" which can be used to generate an error signal. That error signal is used by an electronic servo loop to further stabilize the laser in terms of frequency and phase noise reduction. A cryogenic cooler is required to reduce the linewidth of the spectral holes.

Although various embodiments of diamond-based, high-stability optical devices for precision frequency and time generation are described in some detail later herein, one or more of those embodiments may be characterized by one or more of the following aspects.

One aspect of the subject matter disclosed in detail herein is an optical resonator comprising: a spacer made of diamond and having a bore with openings at first and second surfaces of the spacer; a first mirror substrate made of diamond having a surface fusion bonded to the first surface of the spacer; a second mirror substrate made of diamond having a surface fusion bonded to the second surface of the spacer; a first mirror deposited on the surface of the first mirror substrate and positioned to cover the opening in the first surface of the spacer; and a second mirror deposited on the surface of the second mirror substrate and positioned to cover the opening in the second surface of the spacer, wherein the first and second mirrors are partially transmissive and parallel to each other to form a high-finesse Fabry-Pérot interferometer. The diamond has a crystalline structure formed by chemical vapor deposition.

Another aspect of the subject matter disclosed in detail herein is an optical device comprising: a cryogenic cooler configured to have an operating temperature in a range of 40 to 100° K; a laser which is controllable to emit light having a specified frequency and specified optical power; a diamond chip formed by chemical vapor deposition of diamond crystals, thermally coupled to the cryogenic cooler, optically coupled to receive light from the laser when the laser is activated, and configured to output an optical signal representing an error; a photoreceiver optically coupled to receive the optical signal representing the error from the diamond chip when the laser is activated and configured to output an electrical signal representing the error; and an electronic servo controller which is configured to stabilize the laser in terms of frequency and phase noise reduction based at least in part on the electrical signal representing the error received from the photoreceiver.

In accordance with one embodiment of the optical device described in the immediately preceding paragraph, the diamond crystals of the diamond chip are doped with laser-active rare earth ions to form an absorption spectrum having a pattern of spectral holes. In accordance with another embodiment, the diamond chip has a bore with mutually opposing ends, and the optical device further comprises a first partially transmissive mirror disposed at one end of the bore and a second partially transmissive mirror disposed at another end of the bore. The first and second mirrors are parallel to each other and form a high-finesse Fabry-Pérot interferometer.

A further aspect of the subject matter disclosed in detail herein is an optical device comprising: a cryogenic cooler configured to have an operating temperature in a range of 40 to 100° K; a laser which is controllable to emit light; and a diamond dual-resonator configuration formed by dry etching of CVD diamond crystals, thermally coupled to the cryogenic cooler, and optically coupled to receive light from the laser when the laser is activated. The diamond dual-resonator configuration comprises: a pump waveguide optically coupled to the laser and having a pump wavelength; a first closed circulating loop optically coupled to the pump waveguide; a second closed circulating loop optically coupled to the first closed circulating loop; and an output waveguide optically coupled to the second closed circulating loop.

In accordance with one embodiment of the optical device described in the immediately preceding paragraph, the first closed circulating loop is a Raman gain ring and the second closed circulating loop is a Stokes resonator ring. In accordance with another embodiment, the first closed circulating loop is a rare earth-doped gain ring and the second closed circulating loop is a filter resonator ring.

Yet another aspect of the subject matter disclosed in detail herein is a method for reducing a frequency linewidth of a laser beam, the method comprising: fabricating a diamond structure; cooling the diamond structure to a temperature in a range of 40 to 100° K; emitting light from a laser; guiding light having the first linewidth into the diamond structure; outputting an optical signal representing an error from the diamond structure; converting the optical signal representing the error into an electrical signal representing the error; and stabilizing the laser in terms of frequency and phase noise reduction based at least in part on the electrical signal representing the error.

Other aspects of diamond-based high-stability optical devices for precision frequency and time generation are disclosed below.

BRIEF DESCRIPTION OF THE DRAWINGS

The features, functions and advantages discussed in the preceding section may be achieved independently in various embodiments or may be combined in yet other embodiments. Various embodiments will be hereinafter described with reference to drawings for the purpose of illustrating the above-described and other aspects. None of the diagrams briefly described in this section are drawn to scale.

Reference will hereinafter be made to the drawings in which similar elements in different drawings bear the same reference numerals.

DETAILED DESCRIPTION

For the purpose of illustration, diamond-based, high-stability optical devices for precision frequency and time generation will now be described in detail. However, not all features of an actual implementation are described in this specification. A person skilled in the art will appreciate that in the development of any such embodiment, numerous implementation-specific decisions must be made to achieve the developer's specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

In an atomic clock, the frequency of a natural oscillation of an atom is used as a frequency reference. More specifically, the atomic clock includes a device that produces an oscillatory signal that is in resonance with the atoms' natural oscillations. The clock simply counts cycles of the oscillatory signal. One common method for achieving synchronization is based on observing the atoms' absorption. Typically, the atoms are prepared in one of the two quantum states associated with one of its natural oscillations. Then a local oscillator produces radiation around this oscillation frequency and directs the radiation toward the atoms. The device is constructed so that changes in the state of the atoms are detected. When these state changes occur with maximum probability, then the oscillator frequency is synchronous with the atoms' natural oscillation. To stabilize the frequency of a local oscillator to an atomic transition, a discriminator signal is extracted by comparing the discriminator signal obtained from the atoms to the frequency of applied radiation. This signal can then be fed back to the local oscillator and used to stabilize the oscillator's frequency.

Current ultra-stable, state-of-the-art optical atomic clocks are based on the same operating principle. By design all such systems are based on three key components (1) an ultra-stable, narrow-linewidth optical laser; (2) an atomic reference that provides a very-narrow-linewidth transition that serves as the absolute stability reference; and (3) a frequency comb which translates/divides the optical frequency down to the radio frequency (RF) microwave range to enable clock use in electronic applications.

Unfortunately, a typical optical atomic clock requires bulky components and consumes significant power. Typically, the actual implementation of optical atomic clock is very complicated and, in most cases, utilizes large laboratory setups populated with multiple subcomponents.

In order to use optical atomic clocks in the next generation of GPS satellites and make them a commodity-type technology, a dramatic reduction of Size Weight and Power (SWaP) needs to be implemented in addition to making the technology ruggedized and impervious to environmental disturbances such as temperature and vibration. Each of the three key technology elements described above need to undergo SWaP reduction.

Figure 1:
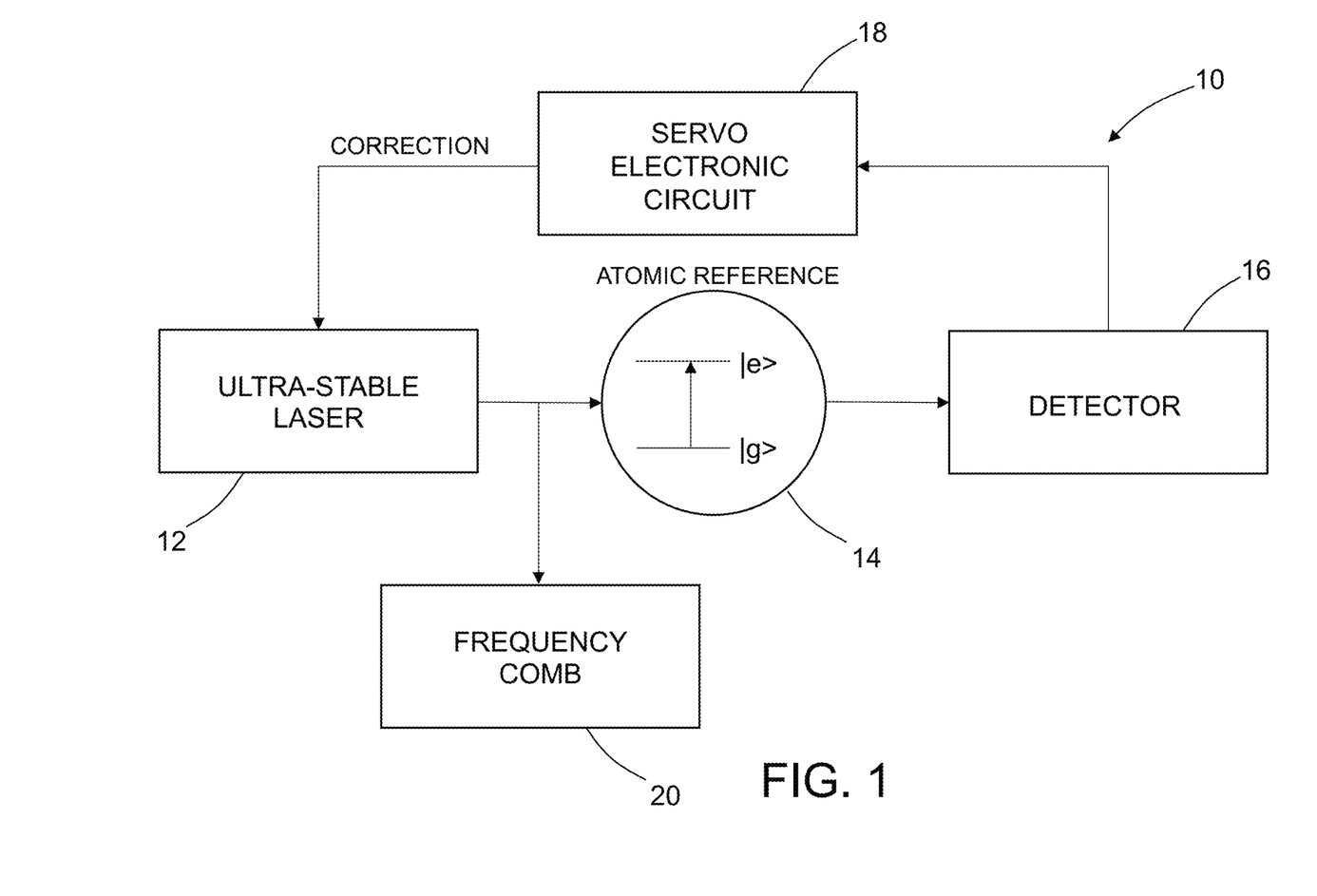
FIG. 1 is a block diagram identifying some components of a typical optical atomic clock.

FIG. 1 is a block diagram identifying some components of a typical optical atomic clock 10. The optical atomic clock 10 includes a steady oscillator in the form of an ultra-stable laser 12 and an atomic reference 14. The ultra-stable laser 12 emits a narrow-linewidth laser light beam toward the atomic reference 14. The ultra-stable laser 12 is regulated using the quantum oscillations of atoms from the atomic reference 14 (e.g., a vapor cell). The atomic reference 14 provides a very-narrow-linewidth transition that serves as the absolute stability reference.

The optical atomic clock 10 further includes a detector 16 (e.g., a photodetector) that is positioned so that the laser light not absorbed by the atomic reference 14 impinges on the detector 16. The absorption of the laser light by the atomic reference 14 is measured by the detector 16. The measurement result is output in the form of an electrical signal. The light power transmitted through the atomic vapor cell changes when the laser modulation frequency coincides with the atomic oscillation frequency. By monitoring this transmitted power with a photodetector, the frequency of the laser modulation can be corrected to correspond to the atomic resonance frequency.

The optical atomic clock 10 further includes a servo electronic circuit 18 which receives the electrical signal from the detector 16. The servo electronic circuit 18 may, for example, be a proportional-integral-derivative (PID) controller that provides continuously modulated control (correction) of the laser frequency that maximizes the absorption of the laser light by the atomic reference 14.

The optical atomic clock 10 further includes a frequency comb 20 which translates/divides the optical frequency down to the RF microwave range to enable clock use in electronic applications. Current ultra-stable, state-of-the-art optical atomic clocks are based on the operating principle schematically illustrated on FIG. 1.

One technique for further stabilizing a stable laser is by phase and frequency locking to an external ultra-stable cavity. Such a device is commonly referred to as an "external-cavity diode laser" (ECDL). An ECDL is a non-monolithic diode laser where the laser cavity (resonator) is completed with external optical elements. The current leading optical atomic clock technologies utilize either ultra-low-expansion (ULE) glass-based external cavities or silicon-based external cavities. An underlying problem of both approaches is that they require a bulky setup and extreme temperature and vibration isolation.

In the case of ULE glass, the cavities are operated near room temperature, which offers the near-zero coefficient of thermal expansion (CTE), but in order to maintain the near-zero CTE, the cavity temperature needs to be kept exceptionally stable, which leads to multiple nested enclosures and a typical weight for the higher performance cavities is in the range of several hundred kilograms. A consequence of the nested enclosures and operation at vacuum is that the cavity response time is very slow, which necessitates one to two months of startup time before such cavity reaches nominal stability and operating conditions.

The optical atomic clock technology based on silicon (Si) utilizes the property of Si CTE to exhibit negative CTE between 4 to 123° K temperatures. This provides two zero-CTE crossing temperatures that can be used for operating the cavity. Silicon cavities are operated at much lower temperature than ULE glass cavities, which reduces thermal noise, thereby making Si cavities inherently more stable. But Si cavities need to be cryogenically cooled and also kept at very stable temperature, because even if the CTE may be zero, the actual slope of the CTE change in temperature is rather steep at the 123° K crossing and more gradual at the 4° K point. For both temperatures, extreme isolation is needed.

Although both types of cavity systems are designed to operate at near-zero CTE, unfortunately at the corresponding operating temperatures, they are at thermal radiative non-equilibrium. For example in the ULE glass case, operation at near room temperature puts the background black body radiation peak in the range of 9-10 µm. But most glasses are absorptive above 5 µm. Therefore, the ULE glass cavity will be exchanging infrared photons with the surrounding enclosure due to the close radiative coupling. Even small changes of the enclosure temperature lead to radiative heating/cooling of the ULE glass cavity.

The same phenomenon is observed for a Si cavity operated at the first zero crossing temperature at 123° K. The black body radiation at this temperature has a peak at ~24 µm. But Si is completely opaque (absorptive) between 10 to ~30 µm and only becomes fully transmissive again at 50 µm.

Therefore, a Si cavity operated at the 123° K zero-CTE crossing temperature will be extremely sensitive even to small changes of the enclosure temperature due to the very strong radiative coupling.

The innovative technology disclosed herein addresses the generation of ultra-stable, narrow-linewidth lasing and offers significant reduction of SWaP compared to the current leading technologies: ULE glass cavities and silicon-based cavities. This disclosure proposes the use of CVD diamond as a material system for ultra-stable oscillators. Chemical vapor deposition is an established technique for depositing material (including diamond) onto a substrate. The diamond-based cavity proposed herein has very low CTE and is fully transparent to thermal radiation at the proposed operating temperature points. Thus, the cavity is decoupled from the enclosure, allowing achievement of thermodynamic balance with much lower total energy input. In addition, the operating points are chosen such that the thermal conductivity of the material is very high, leading to high stability, fast start-up, very efficient temperature control, and reduced SWaP. Four novel approaches, utilizing CVD diamond, to implement high-stability optical oscillators are outlined below.

The first proposed implementation includes a CVD diamond passive cavity which is ultra-stable and has very high finesse. The CVD diamond cavity is used to generate an error signal, which error signal is used by an electronic servo loop to further stabilize the laser in terms of frequency and phase noise reduction. A cryogenic cooler ensures that the operating point of the CVD diamond cavity is maintained for maximum performance stability.

Ultra-pure, low-defect, optical-grade CVD diamond wafers are commercially available. Although CVD diamond has very low optical absorption across most of the electromagnetic spectrum, the highest-quality (Q)-factor cavity requires light propagating in vacuum. Therefore, in this configuration the CVD diamond will be used for the spacer and the mirror substrates.

To form a cavity, two additional techniques are required, and recent advancement of CVD diamond processing have provided technical paths: (1) wafer-to-wafer fusion bonding establishing strong covalent bonds across {001} surfaces; and (2) oxygen-assisted laser cutting and drilling of CVD diamond. These additional techniques, respectively, enable the formation of spacer thickness and the drilling of a bore for the optical beam and standing radiation. Ultra-high reflectivity mirrors will be deposited on separate CVD diamond substrates on {001} surfaces, and then bare surfaces of the spacer will be fusion bonded in ultra-high vacuum. The mirrors are partially transmissive and parallel to each other to form a high-finesse Fabry-Pérot interferometer.

Figure 2:
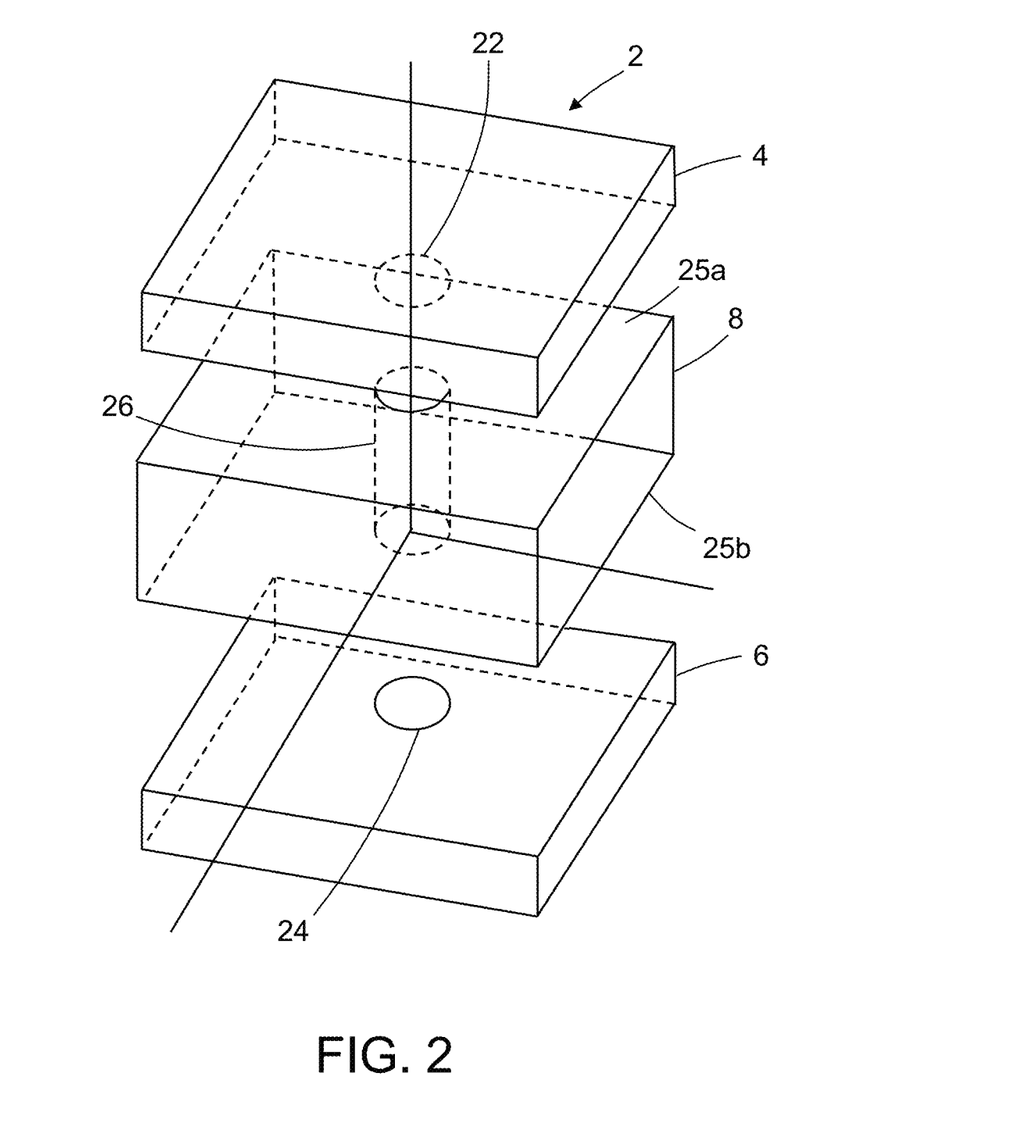
FIG. 2 is a diagram representing a three-dimensional exploded view of parts of an ultra-stable passive cavity (optical resonator) based on CVD diamond in accordance with one proposed implementation.

FIG. 2 is a diagram representing a three-dimensional exploded view of parts of an ultra-stable passive optical resonator (hereinafter "external cavity 2") based on diamond in accordance with one embodiment. The diamond has a crystalline structure formed by chemical vapor deposition.

The external cavity 2 is fabricated by fusion bonding three diamond wafers together in a stack. The middle wafer is a spacer 8 made of CVD diamond and having a bore 26 with openings at first and second surfaces 25a and 25b of the spacer 8. The second wafer is a first mirror substrate 4 made of diamond having a surface fusion bonded to the first surface 25a of the spacer 8. The third wafer is a second mirror substrate 6 made of diamond having a surface fusion bonded to the second surface 25b of the spacer 8.

The external cavity 2 includes a first mirror 22 deposited on the surface of the first mirror substrate 4 that is fusion bonded to the spacer 8. The first mirror 22 is positioned to cover the opening in the first surface 25a of the spacer. The external cavity 2 further includes a second mirror 24 deposited on the surface of the second mirror substrate 6 that is fusion bonded to the spacer 8. The second mirror 24 is positioned to cover the opening in the second surface 25b of the spacer 8. The first and second mirrors 22 and 24 are partially transmissive and parallel to each other to form a high-finesse Fabry-Pérot interferometer. The large surfaces around the mirrors are left for fusion bonding to the spacer 8. The estimated cavity length is 5 to 20 mm; the diameter of bore 26 will be 0.5 to 3 mm.

Figure 3:
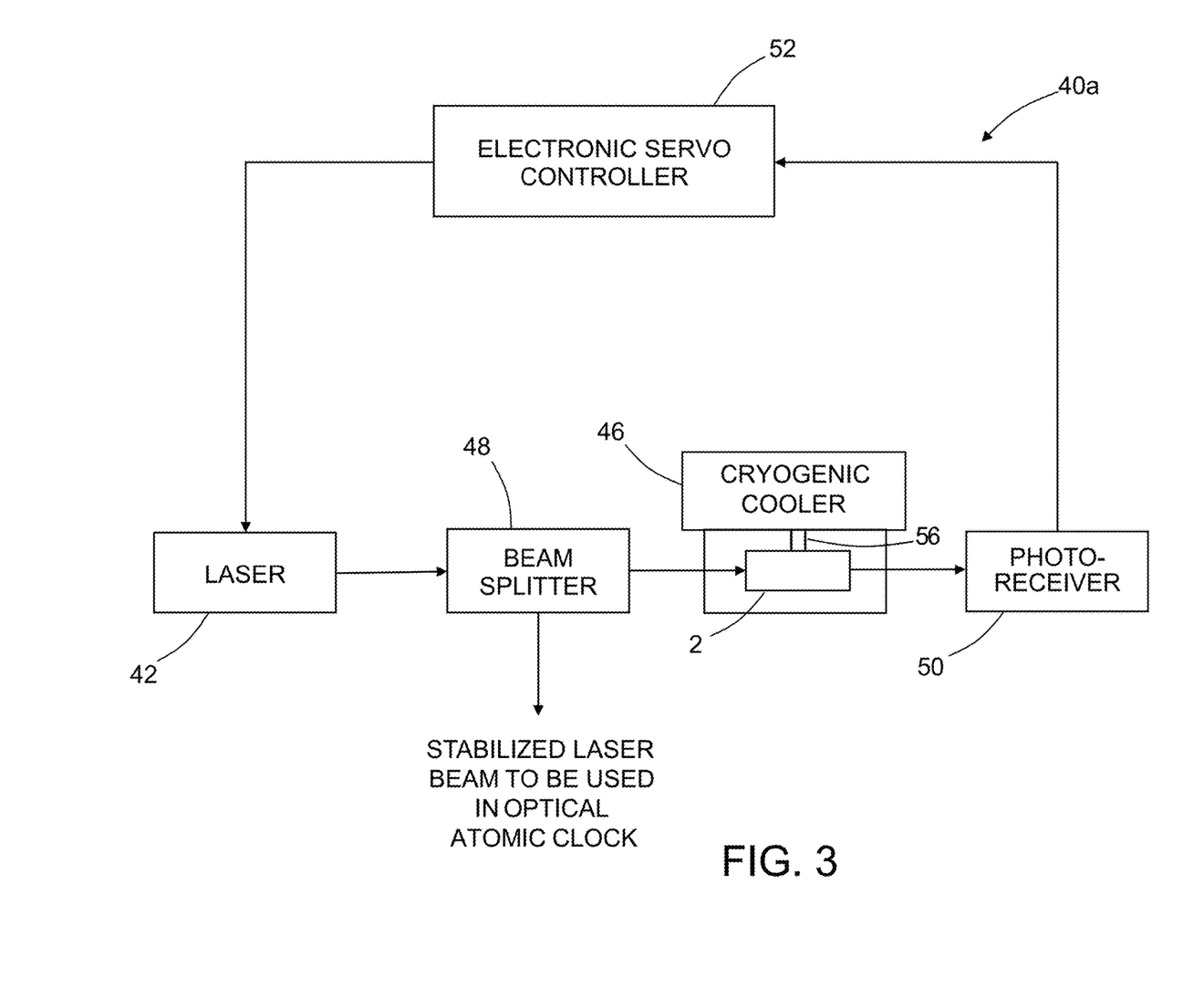
FIG. 3 is a block diagram identifying some components of one implementation of an optical oscillator that includes an external cavity of the type depicted in FIG. 2.

FIG. 3 is a block diagram identifying some components of one implementation of an optical device 40a that includes an external cavity 2 in the form of a diamond chip of the type depicted in FIG. 2. The optical device 40a includes a cryogenic cooler 46 containing liquid nitrogen and a laser 42 which is controllable to emit light. The external cavity 2 is thermally conductively coupled to a cold finger 56 extending from the cryogenic cooler 46 and is optically coupled to receive light from the laser 42 when the laser 42 is activated. The optical device 40a further includes a photoreceiver 50 which is optically coupled to receive light from the external cavity 2 when the laser 42 is activated and to output an electrical signal representing an error signal. The optical device 40a further includes an electronic servo controller 52 which is configured to stabilize the laser 42 in terms of frequency and phase noise reduction based on the error signal received from the photoreceiver 50. The optical device 40a also includes a beam splitter 48 disposed along an optical path of the light emitted by the laser 42 and received by the external cavity 2. The beam splitter 48 directs a stabilized laser beam from laser 42 toward an output waveguide for use in an optical atomic clock of the type shown in FIG. 1.

The laser 42 can be an external cavity semiconductor diode laser, which is a semiconductor die, packaged in a metal housing, with reflective grating, output coupler, lenses, isolator, and fiber. It could be also a different laser such as a distributed feedback (DFB) laser or a fiber laser. Basically there are different lasers with different wavelengths and technologies that can be used, but the underlying feature of laser 42 is that is a low-noise laser that uses the feedback from external cavity 2 to further stabilize its performance, i.e., decrease linewidth and wavelength jitter. The feedback can be used in the case of semiconductor diode lasers to provide correction to the laser current. For fiber lasers, the feedback can be used to tune the temperature of the fiber cavity or a Bragg reflector.

An innovative element of the diamond-based optical device 40a shown in FIG. 3 is the operating conditions of the cryogenic cooler 46. The linear thermal expansion of diamond has a very small rate of change below 100° K. The external cavity 2 will be designed to operate under a high-thermal-conductivity regime in order to minimize the needed energy for stabilization and achieve a fast rate of response. The thermal conductivity of diamond peaks at ~90-100° K. Based on these considerations and the need to utilize a lower-cost simple cryogenic system, the cavity operating point in accordance with one proposed implementation is set near (and less than) 77° K, which is the boiling point of liquid nitrogen ($N_2$). This temperature setting enables high-performance stability of the laser 42.

By choosing $N_2$ for the cryogenic coolant in cryogenic cooler 46, the complexity and cost of the system may be reduced as compared to helium-based cryogenic stations. Also, in the vicinity (slightly below) 77° K, the CTE rate of change for diamond is very low and in fact much lower than published data for Si CTE near-zero crossing points. Therefore, one would expect a diamond-based cavity to be extremely stable and easily controllable at temperatures around 77° K.

Another advantage of operating near 77° K is that the black body radiation at this temperature has a peak at 38 μm with a broad distribution tail to longer wavelengths. The transmission of light through diamond exhibits no absorption in the wavelength range 5-100 μm. Therefore, any ambient radiation surrounding the cavity at 77° K, which will be characterized by a very broad spectrum, will not be absorbed at all by the diamond-based cavity 2. Thus, conductive cooling will be the key temperature control, and a thermodynamic equilibrium may be established faster and at lower external energy.

Diamond may also be configured as a Raman laser. Raman lasers rely on the process of Raman scattering. Spontaneous Raman scattering occurs when a photon incident on a material excites a vibrational mode from an initial energy level to an excited state and then returns to an energy level different from the initial energy level, producing a scattered photon of different energy (and frequency) than the energy (and frequency) of the incident photon. The energy difference between the incident and scattered photons results in the production of a phonon (a quantized lattice vibration).

In accordance with a second proposed implementation, a diamond-based optical oscillator is provided that includes a Raman laser. Diamond material has exceptional properties for Raman gain. Diamond has a very large Raman frequency shift of ~40 THz, a very large Raman gain coefficient (compared to silica), ultra-wideband transmission transparency, exceptional thermal conductivity (minimizes thermal self-lensing), a low thermo-optic coefficient $~10^{-5}/°$ K, negligible birefringence, and extremely narrow Raman gain spectrum (full width at half maximum ~60 GHz) which enables the design of single-mode lasers with reasonably sized resonators.

Figure 4:
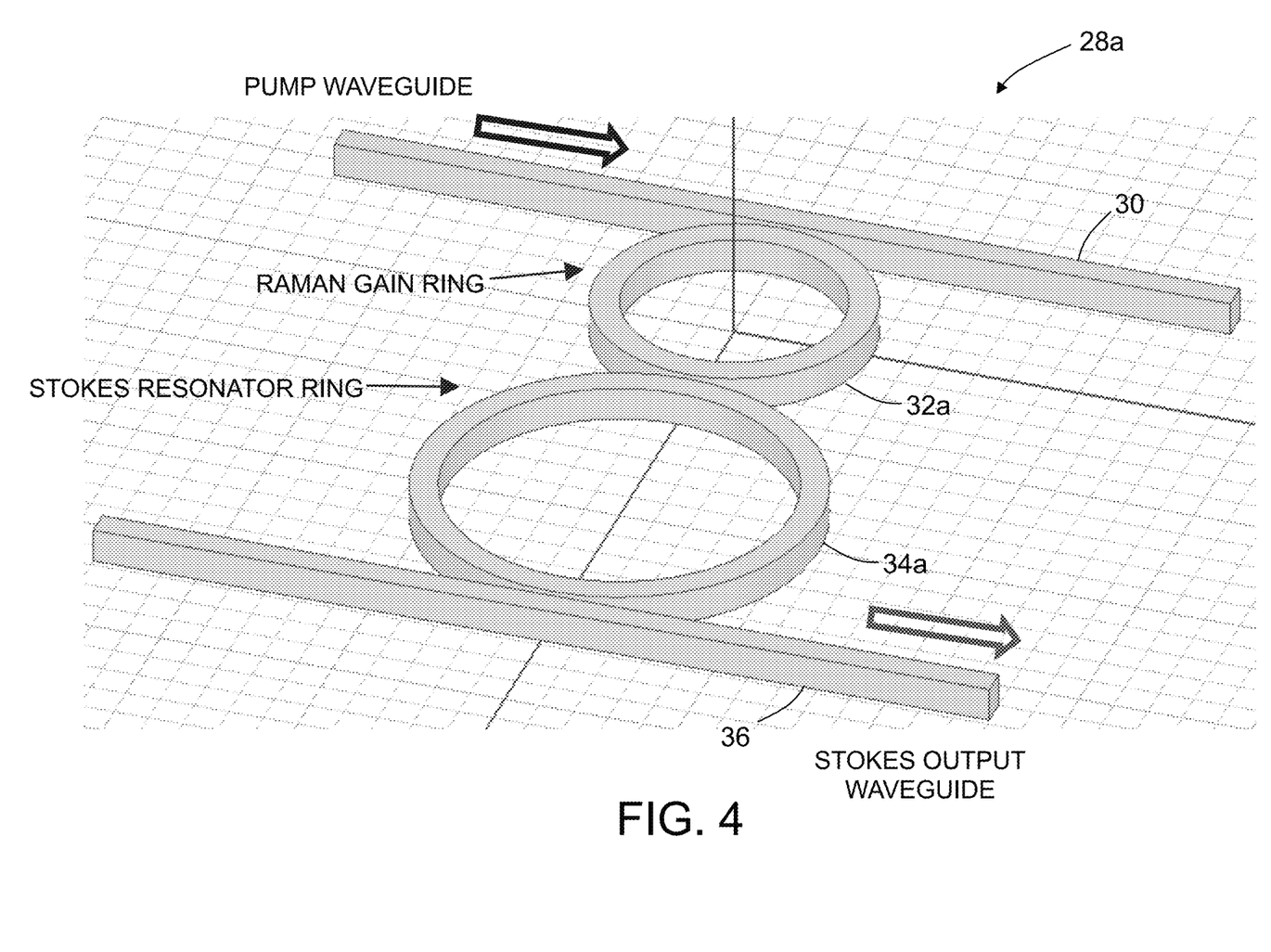
FIG. 4 is a diagram representing a three-dimensional view of an ultra-stable, narrow-linewidth Raman laser based on lasing in CVD diamond with external filtering for linewidth reduction in accordance with another proposed implementation.

FIG. 4 is a diagram representing a three-dimensional view of an ultra-stable, narrow-linewidth Raman laser 28a (hereinafter "Raman laser 28a") based on lasing in CVD diamond with external filtering for linewidth reduction in accordance with another proposed implementation. The Raman laser 28a has a dual-resonator configuration that includes two closed circulating loops made of CVD diamond. The closed circulating loops seen in FIG. 4 are a Raman gain ring 32a and a Stokes resonator ring 34a. In alternative embodiments, the closed circulating loops may be in the form of racetracks. The Raman laser 28a uses low-loss waveguides fabricated by etching CVD diamond wafers to achieve a high Q factor (high finesse).

As seen in FIG. 4, the Raman laser 28a has a dual-resonator configuration comprising: a pump waveguide 30 optically coupled to a pump laser (not shown); a Raman gain ring 32a optically coupled to the pump waveguide 30; a Stokes resonator ring 34a optically coupled to the Raman gain ring 32a; and a Stokes output waveguide 36 optically coupled to the Stokes resonator ring 34a. The pump laser generates lasing (Stokes light) in the Raman gain ring 32a. The Stokes resonator ring 34a is in proximity to the Raman gain ring 32a and is optically coupled to receive evanescent light waves from the Raman gain ring 32a. The Stokes resonator ring 34a has a perimeter which is longer by at least a factor of 4× and could be 10× in order to ensure that the Stokes resonator ring 34a has much higher Q factor and allows higher fractional stability. This means that if the ring dimensions change by, e.g., ½ of a wavelength (because of some external perturbations), then if the ring is much longer fractionally, this change is relatively smaller than if the ring has a shorter perimeter. As a result this ensures higher frequency stability. The filter ring allows no more than 5 longitudinal modes within the 45-GHz Raman gain spectrum. The Stokes resonator ring 34a further reduces the laser linewidth due to its high Q factor and out couples the stable laser output into the Stokes output waveguide 36.

The embodiment depicted in FIG. 4 includes the following details: (a) The operating temperature may be in a range of 40 to 100° K, with a preferred operating temperature near (slightly below) 77° K—the boiling point of liquid nitrogen; (b) The Raman gain ring 32a (circular, elliptical, or race-track-shaped) is made resonant both to pump wavelengths and the first-order Stokes wavelength. Therefore, the Raman gain ring 32a will resonate for both wavelengths; and (c) The Stokes resonator ring 34a (circular, elliptical, or race-track-shaped) will be made longer in order to increase the overall Q factor and will be resonant for the Stokes radiation and anti-resonant for the pump wavelength. This will allow for efficient coupling of the first-order Stokes light and suppressed coupling of the pump light.

Raman lasing will be induced in the Raman gain ring 32a by creating high-resonance pump wavelength intensity and resonant conditions for the Stokes light. The Raman lasing threshold scales as 1 over the product of Q factors for the pump and first-order Stokes wavelengths. Once lasing is established, the laser light will be coupled out to both the pump waveguide 30 and the adjacent Stokes resonator ring 34a. By design, the coupling to the Stokes resonator ring 34a will be strengthened (closer waveguides) in order to create preferential coupling toward the Stokes resonator ring 34a, which will be designed for the highest possible Q factor. The Stokes resonator ring 34a will also have a longitudinal mode that coincides with the Raman gain spectrum of ~60 GHz. In accordance with one proposed implementation, the whole assembly is operated at 77° K with a target linewidth for the Raman lasing limited by the Raman laser natural linewidth and the final linewidth limited by the Q factor of the Stokes resonator ring 34a.

The configuration depicted in FIG. 4 is enabled by the high thermal conductivity of diamond, which allows high optical pump power and high output power. A high-power, narrow-linewidth laser having reduced frequency and amplitude noise may be constructed using diamond due to the following factors:

As the diamond crystal is cooled, the acoustic phonon contributions due to thermal excitations are dramatically reduced The design partly depicted in FIG. 4 utilizes a second ring in addition to the gain ring, which second ring is used to additionally filter the generated Stokes light in the gain ring. This narrows the laser linewidth, thereby achieving frequency noise reduction.

Because of the narrow Raman linewidth of about 45 GHz, a much longer second race track/ring can be fabricated; this will yield a higher Q factor and higher fractional stability. For example, for a 4-mm-long ring, the FSR is ~30 GHz. Thus, there will be only one longitudinal mode overlapping the gain spectrum. This allows much easier alignment of the modes between the gain and filter rings in order to achieve single-mode operation. If the gain was wider as in other Raman gain media, then there would be multiple longitudinal modes, which would lead to mode beating and noise.

The filter ring is resonant for the Stokes light, but not for the light from the pump laser. This will allow efficient coupling only of the Stokes light and not the pump light.

Because there is no upper excited state and population inversion for Raman lasing, there is no spontaneous decay noise or relaxation oscillation type of noise. This eliminates relative intensity noise (RIN) from the lasing process and only leaves the noise from the pump laser. A low-RIN laser should be selected for the pump laser.

Because there is no spectral hole burning in Raman gain, there is no instability in the longitudinal mode intensity. This further reduces amplitude noise.

In accordance with a third proposed implementation, a diamond-based optical oscillator is provided that includes a rare earth-doped laser. The implementation of this alternative embodiment is similar to the above-described Raman laser, but the gain medium is implemented by introducing (doping, implanting) atoms of rare earth elements such as erbium and thulium.

Figure 5:
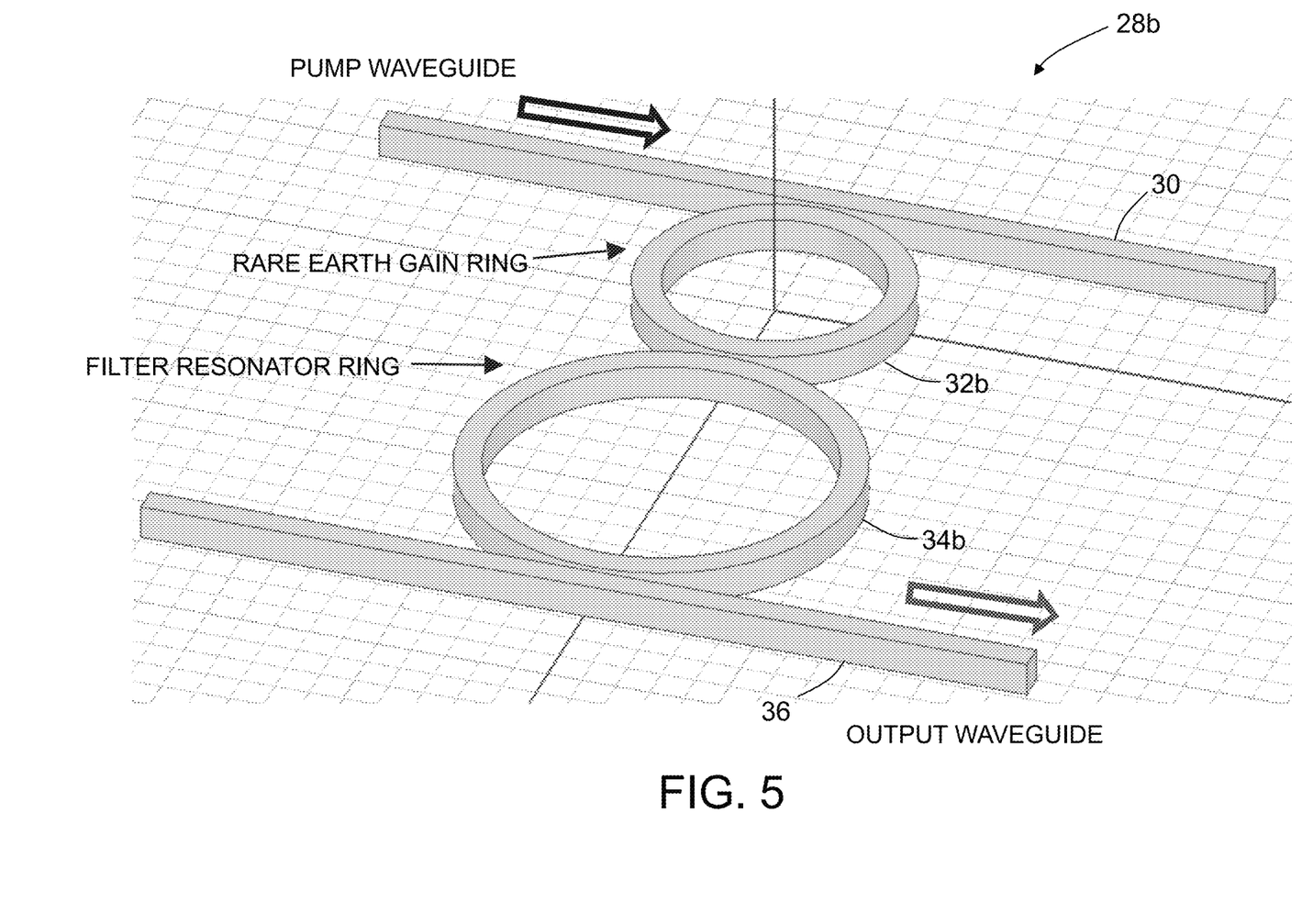
FIG. 5 is a diagram representing a three-dimensional view of an ultra-stable, narrow-linewidth, rare earth-doped laser based on lasing in CVD diamond with external filtering for linewidth reduction in accordance with a further proposed implementation.

FIG. 5 is a diagram representing a three-dimensional view of an ultra-stable, narrow-linewidth, rare earth-doped laser 28b (hereinafter "rare earth-doped laser 28b") based on lasing in CVD diamond with external filtering for linewidth reduction. The rare earth-doped laser 28b is in the form of a Raman ring (or racetrack) chip fabricated by chemical vapor deposition of diamond crystals. The rare earth-doped laser 28b uses low-loss waveguides to achieve a high Q factor (high finesse).

As seen in FIG. 5, the rare earth-doped laser 28b has a dual-resonator configuration comprising: a pump waveguide 30 optically coupled to a pump laser (not shown); a rare earth gain ring 32b optically coupled to the pump waveguide 30; a filter resonator ring 34b optically coupled to the rare earth gain ring 32b; and an output waveguide 36 optically coupled to the filter resonator ring 34b.

The pump laser is coupled into a CVD diamond pump waveguide 30, which transfers light into a CVD diamond ring (or racetrack) chip implemented with low-loss waveguides to achieve a high Q factor (high finesse) resonator. When pumped with light having the pump wavelength, the rare earth gain ring 32b generates lasing at a longer wavelength. This longer wavelength is out coupled by the filter resonator ring 34b, which also has very high Q factor and further reduces the linewidth of the generated radiation. The output waveguide 36 is provided in proximity to the filter resonator ring 34b. Part of the resonant light in the filter resonator ring 34b is coupled out into the output waveguide 36 and guided toward the chip output.

The rare earth-doped laser 28b depicted in FIG. 5 has the following implementation details: (a) The operating temperature is slightly below 77° K; (b) The rare earth gain ring 32b (circular, elliptical, or racetrack-shaped) is implanted/doped with rare earth ions which are activated by thermal annealing; (c) The rare earth gain ring 32b is resonant for the pump light (this can be accommodated with proper selection of the pump wavelength and small thermal tuning of the pump laser); (d) The rare earth gain ring 32b has multiple longitudinal modes in the gain spectrum; and (e) The filter resonator ring 34b (circular, elliptical, or racetrack-shaped) is designed to have a slightly different free spectral range (FSR) than the FSR of the rare earth gain ring 32b. (FSR is the spacing in optical frequency or wavelength between two successive reflected or transmitted optical intensity maxima or minima of an interferometer or diffractive optical element.) This will produce a Vernier effect, and with proper selection of the two FSRs, only a single mode can be coupled to the filter resonator ring 34b. This will allow transmission from the output waveguide 36 of a single-mode lasing that has a characteristic linewidth established by the Q factor of the filter resonator ring 34b and the upper-state lifetime for the rare earth ions used as dopant. Because of its operation at cryogenic temperatures, the rare earth-doped laser 28b will have very low phase and frequency noise.

Figure 6:
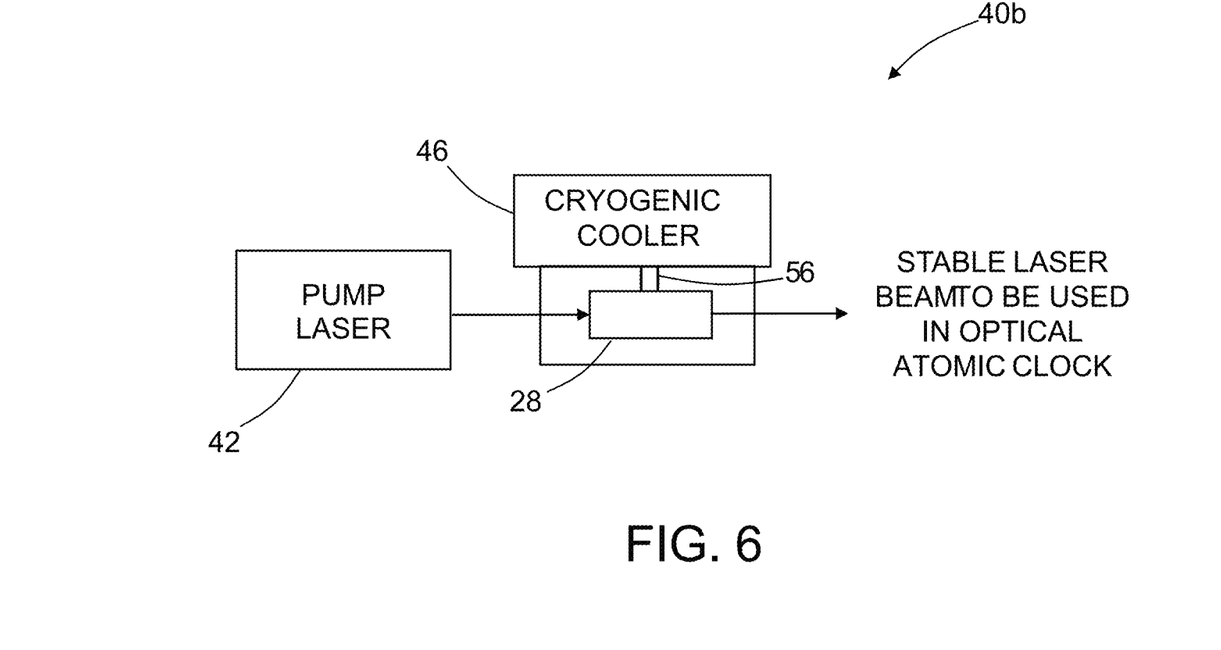
FIG. 6 is a block diagram identifying some components of an optical oscillator that may include either the CVD diamond Raman laser depicted in FIG. 4 or the CVD diamond rare earth-doped laser depicted in FIG. 5.

FIG. 6 is a block diagram identifying some components of an optical device 40b that includes a pump laser 42, a cryogenic cooler 46, and a diamond-based laser 28 which is thermally conductively coupled to a cold finger 56 extending from the cryogenic cooler 46 and optically coupled to the pump laser 42. The diamond-based laser 28 on a chip may be either the CVD diamond Raman laser 28a depicted in FIG. 4 or the CVD diamond rare earth-doped laser 28b depicted in FIG. 5.

Typically pump lasers are semiconductor lasers, which are packaged in butterfly packages. In the case depicted in FIG. 6, the pump laser 42 does not require stabilization, and the feedback control loop is not used. The diamond-based laser 28 is maintained at a temperature slightly below 77° K by the cryogenic cooler 46 while being optically pumped by the pump laser 42. The output of the diamond-based laser 28 is the stabilized laser beam.

In accordance with a fourth proposed implementation, a diamond-based optical device is provided that includes an ultra-stable, narrow-linewidth frequency reference chip based on spectral hole burning in rare earth-doped CVD diamond crystals. The chip is in the form of a rectangular prism or parallelepiped of CVD diamond doped with rare earth ions. The doping may be used to create frequency-selective optical pumping of inhomogeneously broadened absorption lines to spectrally tailor the material response. A narrow-linewidth laser is used to temporarily excite a subset of the ions and remove them from the absorption population. This allows generation of very narrow-linewidth transmission "spectral holes" which can be used to generate an error signal. That error signal is used by an electronic servo loop to further stabilize the laser in terms of frequency and phase noise reduction. A cryogenic cooler is employed to reduce the linewidth of the spectral holes.

Figure 7:
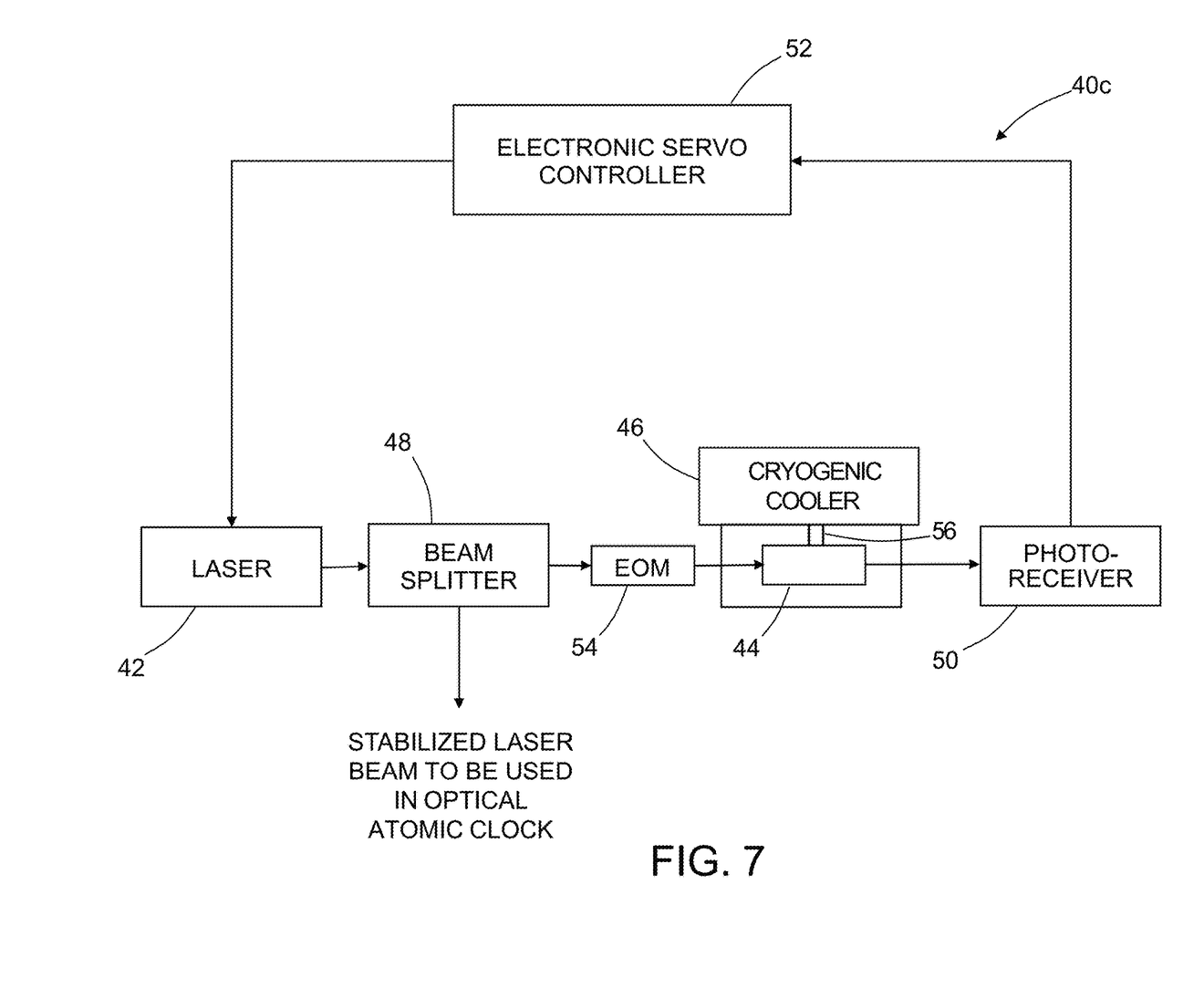
FIG. 7 is a block diagram identifying some components of one implementation of an optical oscillator that includes an ultra-stable, narrow-linewidth frequency reference based on spectral hole burning in rare earth-doped CVD diamond crystals.

FIG. 7 is a block diagram identifying some components of an optical device 40c of the type described in the immediately preceding paragraph. The optical device 40c includes a cryogenic cooler 46 containing liquid nitrogen and a laser 42 which is controllable to emit light. A frequency reference chip 44 is thermally conductively coupled to a cold finger 56 extending from the cryogenic cooler 46 and optically coupled to receive light from the laser 42 when the laser 42 is activated. The optical device 40c further includes a photoreceiver 50 which is optically coupled to receive light from the frequency reference chip 44 when the laser 42 is activated and to output an electrical signal representing an error signal. The optical device 40c further includes an electronic servo controller 52 which is configured to stabilize the laser 42 in terms of frequency and phase noise reduction based on the error signal received from the photoreceiver 50. The optical device 40c also includes a beam splitter 48 disposed along an optical path of the light emitted by the laser 42 and received by the frequency reference chip 44. The beam splitter 48 directs a stabilized laser beam from laser 42 toward an output waveguide for use in an optical atomic clock of the type shown in FIG. 1. The optical device 40c also includes an electro-optical modulator 54 ("EOM 54" in FIG. 7) which is driven with a sinusoidal signal for impressing sidebands onto the laser light.

The fourth implementation utilizes bulk CVD diamond with rare earth elements as dopants (lattice defects). The assembly may be used as a filter of incident optical light by introducing a narrow spectral hole in the rare earth absorption spectrum. The rare earth elements induce inhomogeneous broadening, which narrows as the temperature of the CVD diamond is reduced. In the regime of close to zero phonon optical transitions, a spectral hole can be burned in direct path absorption, and a very narrow sharp transmission can be formed, which transmission may be used to stabilize and lock the incident laser light. Using the very low specific heat of diamond, which is below 100° K, one would expect that the phonon energy distribution will be very narrow and allow for burning narrow spectral holes at operation near (slightly below) 77° K.

In all of the implementations described above, the thermally conductive coupling of the CVD diamond chip to a cryogenic cooler containing liquid nitrogen provides exceptional thermal stability of the assembly, which in turn will produce very low frequency and phase noise in the laser beam being supplied to the optical atomic clock.

The chip technology disclosed herein enables the provision of a portable and compact optical atomic clock system that can be installed on satellites and other avionic platforms. CVD diamond cavities in chip form may be used as part of a future GPS system or as an onboard clock for high-resolution Synthetic Aperture Radar (SAR, BiSAR, multi-SAR) satellites, global timekeeping, and synchronization to time standards. The disclosed CVD diamond cavities may also be used to generate ultra-stable frequency references.

While diamond-based, high-stability optical devices for precision frequency and time generation have been described with reference to various embodiments, it will be understood by those skilled in the art that various changes may be made and equivalents may be substituted for elements thereof without departing from the scope of the teachings herein. In addition, many modifications may be made to adapt the teachings herein to a particular situation without departing from the scope thereof. Therefore it is intended that the claims not be limited to the particular embodiments disclosed herein.

The embodiments disclosed above use one or more controllers. As used in the claims, the term "controller" comprises a single processing or computing device or multiple processing or computing devices that communicate via electrical conductors or wireless transmissions. Such processing or computing devices typically include one or more of the following: a processor, a controller, a central processing unit, a microcontroller, a reduced instruction set computer processor, an application-specific integrated circuit, a programmable logic circuit, a field-programmable gated array, a digital signal processor, and/or any other circuit or processing device capable of executing the functions described herein.

The process claims set forth hereinafter should not be construed to require that the steps recited therein be performed in alphabetical order (any alphabetical ordering in the claims is used solely for the purpose of referencing previously recited steps) or in the order in which they are recited unless the claim language explicitly specifies or states conditions indicating a particular order in which some or all of those steps are performed. Nor should the process claims be construed to exclude any portions of two or more steps being performed concurrently or alternatively unless the claim language explicitly states a condition that precludes such an interpretation.

The invention claimed is:

1. An optical resonator comprising:
    a spacer made of diamond and having a bore with openings at first and second surfaces of the spacer;
    a first mirror substrate made of diamond having a first portion of a surface fusion bonded to the first surface of the spacer;
    a second mirror substrate made of diamond having a first portion of a surface fusion bonded to the second surface of the spacer;
    a first mirror deposited on a second portion of the surface of the first mirror substrate and positioned to cover the opening in the first surface of the spacer; and
    a second mirror deposited on a second portion of the surface of the second mirror substrate and positioned to cover the opening in the second surface of the spacer,
    wherein the first and second mirrors are partially transmissive and parallel to each other to form a high-finesse Fabry-Pérot interferometer.

2. The optical resonator as recited in claim 1, wherein:
    the first mirror is bonded to the second portion of the surface of the first mirror substrate; and
    the second mirror is bonded to the second portion of the surface of the second mirror substrate.

3. The optical resonator as recited in claim 1, wherein the diamond has a crystalline structure formed by chemical vapor deposition (CVD).

4. The optical resonator as recited in claim 3, wherein the spacer comprises a plurality of wafers fusion bonded across {001} surfaces.

5. The optical resonator as recited in claim 3, wherein the surfaces of the first and second mirror substrates on which the first and second mirrors are respectively deposited are {001} surfaces.

6. The optical resonator as recited in claim 1, wherein the bore in the spacer has a length in a range of 5 to 20 mm and a diameter in a range of 0.5 to 3 mm.

7. An optical device comprising:
    a cryogenic cooler configured to have an operating temperature in a range of 40 to 100° K;
    a laser which is controllable to emit light having a specified frequency and specified optical power;
    a diamond chip formed by chemical vapor deposition of diamond crystals, thermally coupled to the cryogenic cooler, optically coupled to receive light from the laser when the laser is activated, and configured to output an optical signal representing an error;
    a photoreceiver optically coupled to receive the optical signal representing the error from the diamond chip when the laser is activated and configured to output an electrical signal representing the error; and
    an electronic servo controller configured to stabilize the laser in terms of frequency and phase noise reduction based, at least in part, on the electrical signal representing the error received from the photoreceiver;
    wherein the diamond chip has a bore with mutually opposing ends, further comprising a first partially transmissive mirror disposed at one end of the bore and a second partially transmissive mirror disposed at another end of the bore, wherein the first and second mirrors are parallel to each other and form a high-finesse Fabry-Pérot interferometer; and
    wherein the diamond chip comprises:
    a spacer made of diamond crystals and having the bore with openings at first and second surfaces of the spacer;
    a first mirror substrate made of diamond crystals having a first portion of a surface fusion bonded to the first surface of the spacer and having the first mirror deposited on a second portion of the surface; and a second mirror substrate made of diamond crystals having a first portion of a surface fusion bonded to the second surface of the spacer and having the second mirror deposited on a second portion of the surface.

8. The optical device as recited in claim 7, further comprising a beam splitter disposed along an optical path of the light emitted by the laser and received by the diamond chip.

9. The optical device as recited in claim 7, wherein the spacer comprises a plurality of wafers fusion bonded across {001} surfaces.

10. The optical device as recited in claim 7, wherein the surfaces of the first and second mirror substrates on which the first and second mirrors are respectively deposited are {001} surfaces.

11. The optical device as recited in claim 7, wherein the bore has a length in a range of 5 to 20 mm and a diameter in a range of 0.5 to 3 mm.

12. A method for operating a laser beam with reduced frequency linewidth, the method comprising:

fabricating a high-finesse Fabry-Pérot interferometer comprising a spacer made of diamond bonded to first and second mirror substrates made of diamond;

cooling the Fabry-Pérot interferometer to a temperature in a range of 40 to 100° K;

emitting, from a laser, light having a linewidth;

guiding the light into the Fabry-Pérot interferometer;

outputting an optical signal representing an error from the Fabry-Pérot interferometer;

converting the optical signal representing the error into an electrical signal representing the error; and stabilizing the laser in terms of frequency and phase noise reduction based, at least in part, on the electrical signal representing the error.

13. The method as recited in claim 12, wherein fabricating the high-finesse Fabry-Pérot interferometer comprises:

fabricating a spacer made of diamond using chemical vapor deposition, wherein the spacer has a bore;

fabricating first and second mirror substrates made of diamond using chemical vapor deposition;

depositing first and second partially transmissive mirrors on the first and second mirror substrates respectively; and fusion bonding the first and second mirror substrates to opposite sides of the spacer to form a high-finesse Fabry-Pérot interferometer.

14. The method as recited in claim 13, wherein:

the bore has respective openings at first and second surfaces of the spacer;

the first mirror substrate has a first portion of a surface fusion bonded to the first surface of the spacer;

the second mirror substrate has a first portion of a surface fusion bonded to the second surface of the spacer;

the first mirror is deposited on a second portion of the surface of the first mirror substrate and positioned to cover the opening in the first surface of the spacer; and the second mirror is deposited on a second portion of the surface of the second mirror substrate and positioned to cover the opening in the second surface of the spacer.

15. The method as recited in claim 14, wherein the spacer comprises a plurality of wafers fusion bonded across {001} surfaces.

16. The method as recited in claim 14, wherein the surfaces of the first and second mirror substrates on which the first and second mirrors are respectively deposited are {001} surfaces.

17. The method as recited in claim 14, wherein the bore has a length in a range of 5 to 20 mm and a diameter in a range of 0.5 to 3 mm.

* * * * *